United States Patent
Lee

(10) Patent No.: US 9,959,917 B2
(45) Date of Patent: May 1, 2018

(54) OUTPUT TIMING CONTROL CIRCUIT OF SEMICONDUCTOR APPARATUS AND METHOD THEREOF

(71) Applicant: SK hynix Inc., Icheon-si Gyeonggi-do (KR)

(72) Inventor: Dong Uk Lee, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 369 days.

(21) Appl. No.: 14/573,806

(22) Filed: Dec. 17, 2014

(65) Prior Publication Data

US 2016/0071563 A1   Mar. 10, 2016

(30) Foreign Application Priority Data

Sep. 5, 2014  (KR) .................. 10-2014-0118856

(51) Int. Cl.
| | |
|---|---|
| *G11C 7/22* | (2006.01) |
| *G11C 7/10* | (2006.01) |
| *G06F 13/16* | (2006.01) |

(52) U.S. Cl.
CPC .......... *G11C 7/222* (2013.01); *G06F 13/1689* (2013.01); *G11C 7/1066* (2013.01)

(58) Field of Classification Search
CPC ........ G11C 7/222; G11C 11/4076; G11C 7/22
See application file for complete search history.

(56) References Cited

U.S. PATENT DOCUMENTS

| | | | | |
|---|---|---|---|---|
| 6,813,197 B2* | 11/2004 | Park | ..................... | G11C 7/1066 |
| | | | | 365/194 |
| 6,985,401 B2* | 1/2006 | Jang | ........................ | G11C 7/22 |
| | | | | 365/194 |
| 7,137,022 B2* | 11/2006 | Ishikawa | ............. | G11C 7/1051 |
| | | | | 327/156 |
| 7,394,886 B2* | 7/2008 | Fujisawa | ............. | G11C 7/1045 |
| | | | | 377/118 |
| 7,453,753 B2* | 11/2008 | Chun | ................... | G11C 7/1072 |
| | | | | 365/222 |
| 7,698,589 B2* | 4/2010 | Huang | ..................... | G06F 5/06 |
| | | | | 713/400 |

(Continued)

FOREIGN PATENT DOCUMENTS

KR    101010649 B1    1/2011

*Primary Examiner* — Son Mai
*Assistant Examiner* — Roberto Mancera
(74) *Attorney, Agent, or Firm* — William Park & Associates Ltd.

(57) ABSTRACT

An output timing control circuit of a semiconductor apparatus may include a strobe signal generation path configured to control a latency and a delay time of an internal signal, and generate a strobe signal. The output timing control circuit may include a first detection block configured to detect a phase difference of the strobe signal and a clock signal, and control the delay time according to the detected phase difference. The output timing control circuit may include a second detection block configured to detect a latency difference of the strobe signal and the internal signal, and control the latency according to the detected latency difference. The internal signal may be generated according to a preset timing of a command received by the strobe signal generation path.

20 Claims, 7 Drawing Sheets

(56) References Cited

U.S. PATENT DOCUMENTS

2013/0283001 A1\* 10/2013 Ishikawa .................. G11C 7/22
    711/167
2016/0071563 A1\* 3/2016 Lee ..................... G06F 13/1689
    365/189.07

\* cited by examiner

OUTPUT TIMING CONTROL CIRCUIT OF SEMICONDUCTOR APPARATUS AND METHOD THEREOF

CROSS-REFERENCES TO RELATED APPLICATION

The present application claims priority under 35 U.S.C. § 119(a) to Korean application number 10-2014-0118856, filed on Sep. 5, 2014, in the Korean Intellectual Property Office, which is incorporated herein by reference in its entirety.

BACKGROUND

1. Technical Field

Various embodiments generally relate to a semiconductor apparatus, and more particularly, to an output timing control circuit of a semiconductor apparatus and a method thereof.

2. Related Art

A semiconductor apparatus may use a delay-locked loop (DLL). The delay-locked loop may be used to compensate for the skew of a strobe signal for notifying a data output timing to a data reception device and a clock signal.

Also, a domain crossing circuit may be used. The domain crossing circuit may be used to compensate for a clock domain difference induced by the delay-locked loop.

However, in the case of the delay-locked loop, problems are likely to be caused involving a locking time after power-down. The locking time after power-down may be long and current consumption in a standby mode may be substantial.

Further, a problem may exist due to the layout margin decreasing due to an increase in a circuit area by the delay-locked loop and the domain crossing circuit.

SUMMARY

In an embodiment, an output timing control circuit of a semiconductor apparatus may include a strobe signal generation path configured to control a latency and a delay time of an internal signal. The strobe signal generation path may generate a strobe signal. The output timing control circuit may include a first detection block configured to detect a phase difference of the strobe signal and a clock signal, and control the delay time according to the detected phase difference. The output timing control circuit may include a second detection block configured to detect a latency difference of the strobe signal and the internal signal, and control the latency according to the detected latency difference. The internal signal may be generated according to a preset timing of a command received by the strobe signal generation path.

In an embodiment, an output timing control circuit of a semiconductor apparatus may include a strobe signal generation path configured to control a phase of an internal signal in response to a delay control signal. The internal signal may be generated according to a read command. The strobe signal generation path may be configured to control a latency of the internal signal in response to a read latency and latency compensation codes, and generate a strobe signal. The output timing control circuit may include a first detection block configured to detect a phase difference of a feedback strobe signal and a delayed clock signal, and generate the delay control signal according to the detected phase difference. The output timing control circuit may include a second detection block configured to detect a latency difference of the feedback strobe signal and the internal signal, and generate the latency compensation codes according to the detected latency difference.

In an embodiment, an output timing control method of a semiconductor apparatus may include detecting a phase difference of a strobe signal and a clock signal. The output timing control method of a semiconductor apparatus may include controlling a phase of the strobe signal according to the phase difference. The output timing control method of a semiconductor apparatus may include detecting latency compensation codes for compensating for a latency difference of an internal signal and the strobe signal. The output timing control method of a semiconductor apparatus may include controlling a read latency according to the latency compensation codes.

DETAILED DESCRIPTION

Hereinafter, an output timing control circuit of a semiconductor apparatus and a method thereof will be described below with reference to the accompanying drawings through various examples of embodiments.

Various embodiments may be directed to an output timing control circuit of a semiconductor apparatus capable of minimizing a time required to compensate for the skew of a strobe, reducing current consumption and decreasing a circuit area, and a method thereof.

Figure 1:
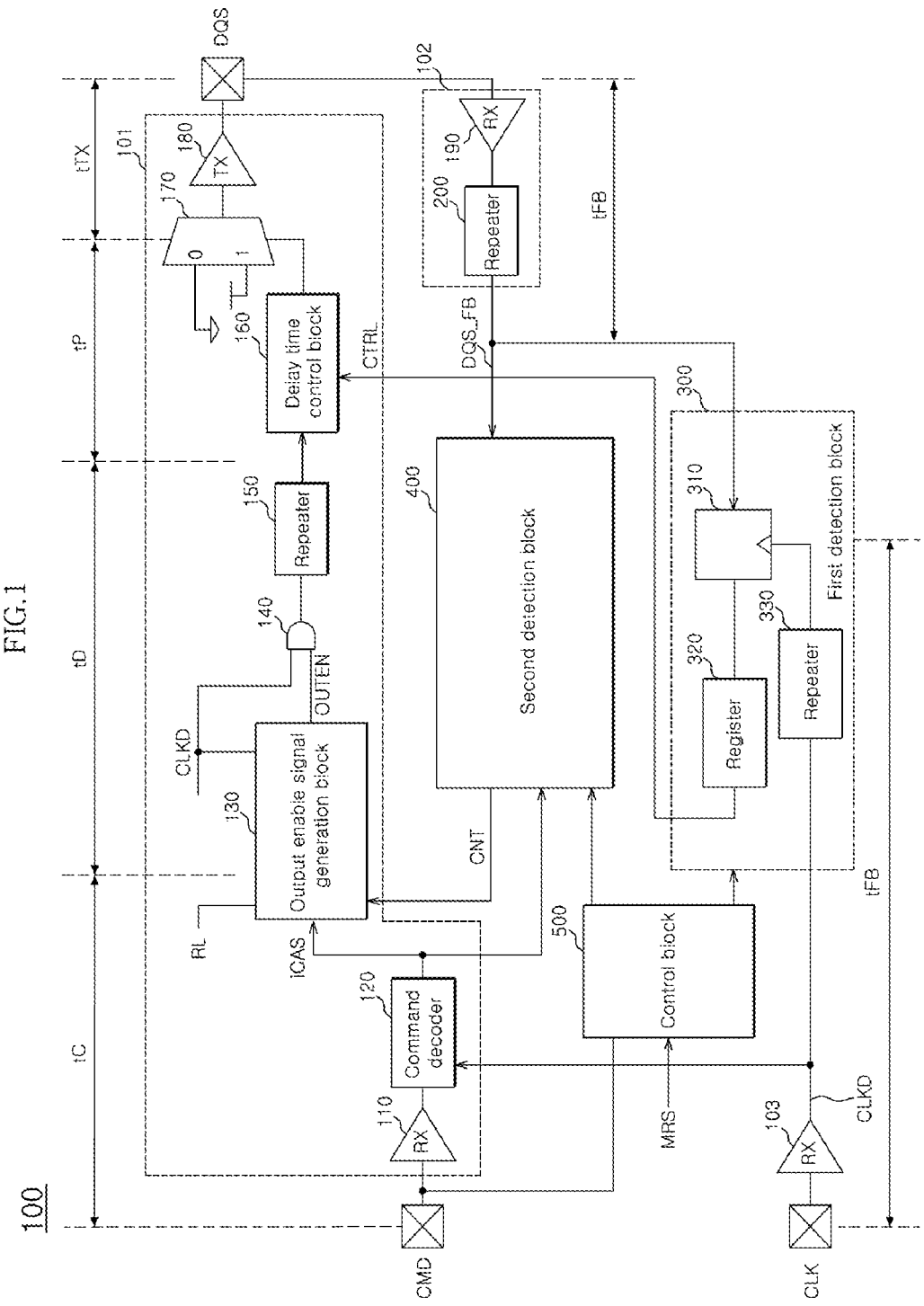
FIG. 1 is a block diagram illustrating a representation of an example of an output timing control circuit of a semiconductor apparatus in accordance with an embodiment.

Referring to FIG. 1, an output timing control circuit 100 of a semiconductor apparatus in accordance with an embodiment may include a strobe signal generation path 101, a feedback path 102, and a receiver 103. The output timing control circuit 100 of a semiconductor apparatus may include a first detection block 300, a second detection block 400, and a control block 500.

The strobe signal generation path 101 may be configured to control the latency and delay time of an internal signal iCAS. The internal signal iCAS may be generated according to a command CMD. The strobe signal generation path 101 may generate a strobe signal DQS.

The command CMD may be provided from an exterior of the output timing control circuit or the semiconductor apparatus, or be internally generated within the output timing control circuit or the semiconductor apparatus, and may include a read command.

The strobe signal DQS may be a signal for notifying a data output timing to a device that receives data.

The strobe signal generation path 101 may be configured to generate the strobe signal DQS. The strobe signal DQS may be generated in response to the internal signal iCAS, latency compensation codes CNT, and a delay control signal CTRL. The internal signal iCAS may be generated by decoding the command CMD.

The strobe signal generation path 101 may include a receiver (RX) 110, a command decoder 120, and an output enable signal generation block 130. The strobe signal generation path 101 may include a logic gate 140, a repeater 150, and a delay time control block 160. The strobe signal generation path 101 may include a multiplexing block 170 and a transmitter (TX) 180.

The receiver 110 may be configured to receive the command CMD from a device exterior to the output timing control circuit 100.

The command decoder 120 may be configured to decode the command CMD received through the receiver 110 or internally generated, according to a delayed clock signal CLKD, and generate the internal signal iCAS.

The output enable signal generation block 130 may be configured to control the latency of the internal signal iCAS according to a read latency RL, the latency compensation codes CNT and the delayed clock signal CLKD, and generate an output enable signal OUTEN.

The output enable signal generation block 130 may be configured to shift the internal signal iCAS by a latency controlled according to the read latency RL and the latency compensation codes CNT, based on the delayed clock signal CLKD, and output the output enable signal OUTEN.

The logic gate 140 may be configured to output the output enable signal OUTEN in synchronization with the delayed clock signal CLKD.

The repeater 150 may be configured to buffer the output of the logic gate 140 and output a resultant signal.

The delay time control block 160 may be configured to control the delay time of the output enable signal OUTEN having passed through the logic gate 140 and the repeater 150, according to the delay control signal CTRL, and output a resultant signal.

The delay time control block 160 may control the phase of the output enable signal OUTEN by controlling the delay time of the output enable signal OUTEN having passed through the logic gate 140 and the repeater 150.

The multiplexing block 170 may be configured to output a logic high signal or a logic low signal in response to the output of the delay time control block 160, and thereby generate the strobe signal DQS.

The multiplexing block 170 may output a power supply level as the logic high signal (i.e., predetermined level). The multiplexing block 170 may output a ground level as the logic low signal (i.e., predetermined level).

The transmitter 180 may output the strobe signal DQS to the exterior through an output pad.

The first detection block 300 may be configured to detect a phase difference tDQSCK (Not illustrated) between the strobe signal DQS and a clock signal CLK, and control the delay time of the strobe signal generation path 101 according to the detected phase difference tDQSCK.

The strobe signal DQS may be provided as a feedback strobe signal DQS_FB, to the first detection block 300 via the feedback path 102.

The clock signal CLK may be provided as the delayed clock signal CLKD, to the first detection block 300 via the receiver 103.

The first detection block 300 may be configured to detect the phase difference of the feedback strobe signal DQS_FB and the delayed clock signal CLKD. The first detection block 300 may be configured to generate the delay control signal CTRL for controlling the delay time of the strobe signal generation path 101, according to the detected phase difference.

The first detection block 300 may include a flip-flop 310, a register 320, and a repeater 330.

The flip-flop 310 may be configured to store the value of the feedback strobe signal DQS_FB, based on the delayed clock signal CLKD.

The register 320 may be configured to store the output of the flip-flop 310. The register 320 may be configured to output a stored value as the delay control signal CTRL.

The repeater 330 may be configured to transmit the delayed clock signal CLKD to the flip-flop 310.

The second detection block 400 may be configured to detect a latency difference between the strobe signal DQS and the internal signal iCAS. The second detection block 400 may be configured to control the latency of the internal signal iCAS according to the detected latency difference.

The strobe signal DQS may be provided as the feedback strobe signal DQS_FB, to the second detection block 400 via the feedback path 102.

The second detection block 400 may be configured to detect the latency difference of the feedback strobe signal DQS_FB and the internal signal iCAS. The second detection block 400 may be configured to generate the latency compensation codes CNT for controlling the latency of the internal signal iCAS according to the detected latency difference.

The control block 500 may generate the command CMD such that the internal signal iCAS is generated at the timing determined based on a mode register set signal MRS.

The control block 500 may be configured to control the activation periods of the first detection block 300 and the second detection block 400 to conform to the sequence set based on the mode register set signal MRS.

The control block 500 may be configured to deactivate the first detection block 300 and the second detection block 400 after the initialization period of the semiconductor apparatus, based on the mode register set signal MRS.

The feedback path 102 may be configured to transmit the strobe signal DQS applied to the output pad, to the first detection block 300 and the second detection block 400, as the feedback strobe signal DQS_FB.

The feedback path 102 may include a receiver 190. The feedback path 102 may include a repeater 200.

The receiver 103 may be configured to receive the clock signal CLK from an exterior to the output timing control circuit 100 through a pad, and output the delayed clock signal CLKD.

Figure 2:
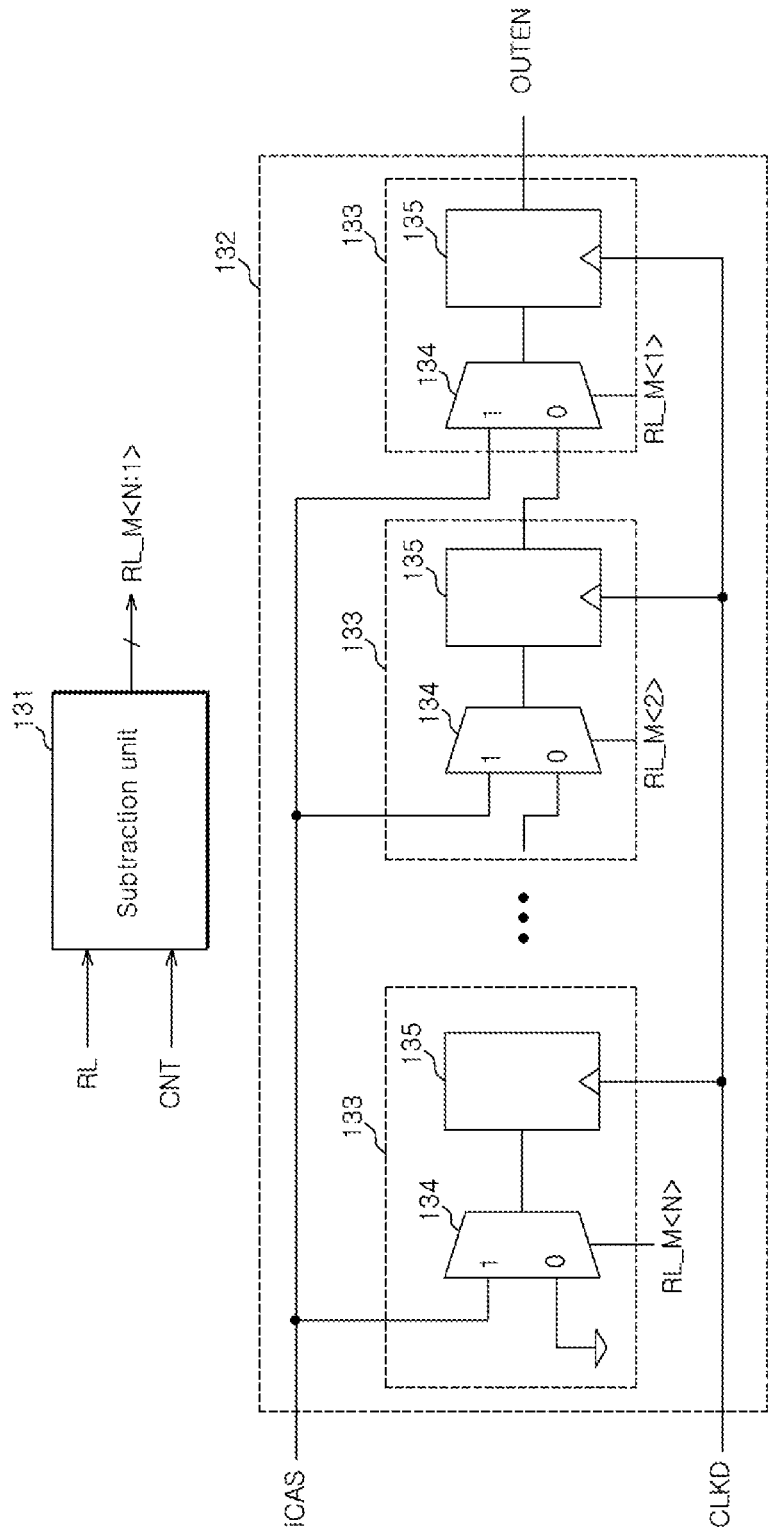
FIG. 2 is a circuit diagram illustrating a representation of an example of the output enable signal generation block illustrated in FIG. 1.

Referring to FIG. 2, the output enable signal generation block 130 may include a subtraction unit 131 and a shifter 132.

The subtraction unit 131 may be configured to calculate the difference values of the read latency RL and the latency compensation codes CNT, and generate controlled latencies RL_M<N:1>.

The shifter 132 may be configured to output a signal generated by shifting the internal signal iCAS based on the delayed clock signal CLKD in conformity with the controlled latencies RL_M<N:1>, as the output enable signal OUTEN.

The shifter 132 may include a plurality of unit shift sections 133.

Each unit shift section 133 may be configured by a multiplexer 134 and a flip-flop 135.

The multiplexer 134 may be configured to select and output one of the internal signal iCAS and the output of a flip-flop 135 of a previous stage (the ground level in the example of an initial multiplexer 134), according to the signal bit inputted thereto among the controlled latencies RL_M<N:1>.

The flip-flop 135 may be configured to receive the output of the multiplexer 134 based on the delayed clock signal CLKD, and transmit it to a multiplexer 134 of a next stage.

The output enable signal OUTEN may be outputted from a flip-flop 135 of a final stage.

Figure 3:
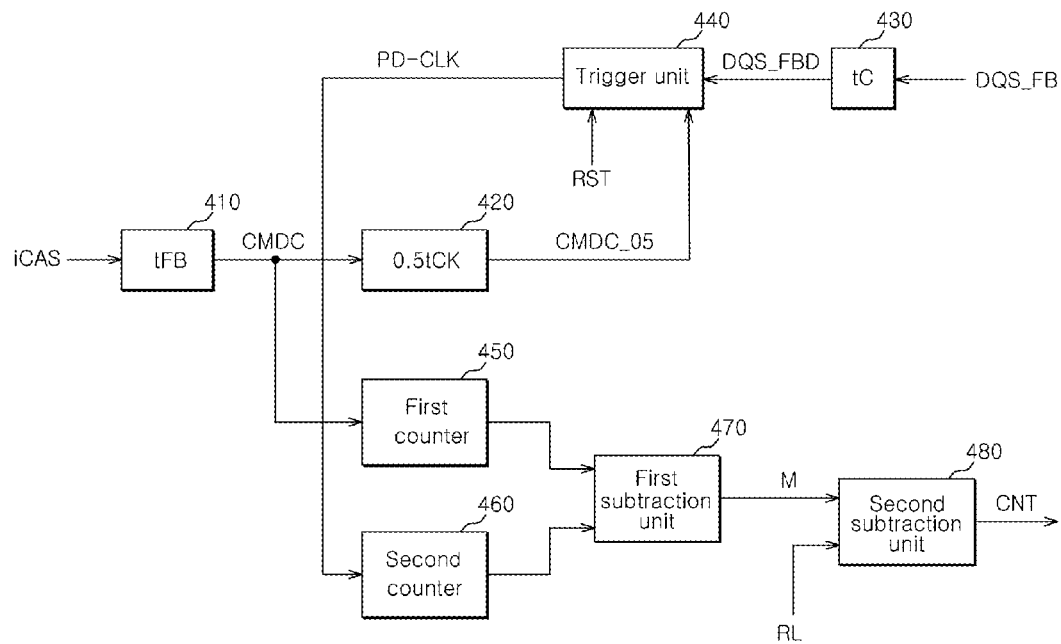
FIG. 3 is a block diagram illustrating a representation of an example of the configuration of the second detection block illustrated in FIG. 1.

Referring to FIG. 3 (see also FIG. 1), the second detection block 400 may include first to third delay units 410 to 430, a trigger unit 440, and a first counter 450. The second detection block 400 may include a second counter 460, a first subtraction unit 470, and a second subtraction unit 480.

The first to third delay units 410 to 430 may be configured to have the same delay times as a feedback delay time tFB, a 0.5tCK and a command delay time tC, respectively.

The feedback delay time tFB may be the signal processing time of the feedback path 102, that is, the receiver 190 and the repeater 200 as a circuit configuration (see FIG. 1), corresponding to a delay time for generating the feedback strobe signal DQS_FB by using the strobe signal DQS.

The signal processing time of the receiver 103 and the repeater 330 may have the same value as the feedback delay time tFB (see FIG. 1).

The 0.5tCK may be a time corresponding to one half cycle of the clock signal CLK.

The command delay time tC may be a time from the input of the command CMD received from the exterior to the generation of the internal signal iCAS (see FIG. 1).

The first delay unit 410 may delay the internal signal iCAS by the feedback delay time tFB, and generate a first delayed signal CMDC.

The second delay unit 420 may delay the first delayed signal CMDC by the 0.5tCK, and generate a second delayed signal CMDC_05.

The third delay unit 430 may delay the feedback strobe signal DQS_FB by the command delay time tC, and generate a third delayed signal DQS_FBD.

The internal signal iCAS and the feedback strobe signal DQS_FB are provided to the second detection block 400 through different signal paths.

In order for the precise detecting operation of the second detection block 400, the respective delay times of the internal signal iCAS and the feedback strobe signal DQS_FB should be compensated for.

The second detection block 400 may compensate for the command delay time tC for the feedback strobe signal DQS_FB through the third delay unit 430, and compensate for the feedback delay time tFB for the internal signal iCAS through the first delay unit 410.

The second delay unit 420 may be added to secure the operation margin, that is, the setup/hold (S/H) time, of the second detection block 400.

The trigger unit 440 may be configured to generate pulses after the third delayed signal DQS_FBD is activated, among the pulses of the second delayed signal CMDC_05 as a trigger signal PD_CLK.

The first counter 450 may be configured to count the first delayed signal CMDC. The first delayed signal CMDC is outputted from the first delay unit 410 and received by the first counter 450.

The second counter 460 may be configured to count the trigger signal PD_CLK. The trigger signal PD_CLK is outputted from the trigger unit 440 and received by the second counter 460.

The first subtraction unit 470 may be configured to subtract the output of the second counter 460 from the output of the first counter 450, and generate a strobe latency M.

The second subtraction unit 480 may be configured to subtract the read latency RL from the strobe latency M, and generate the latency compensation codes CNT.

Figure 4:
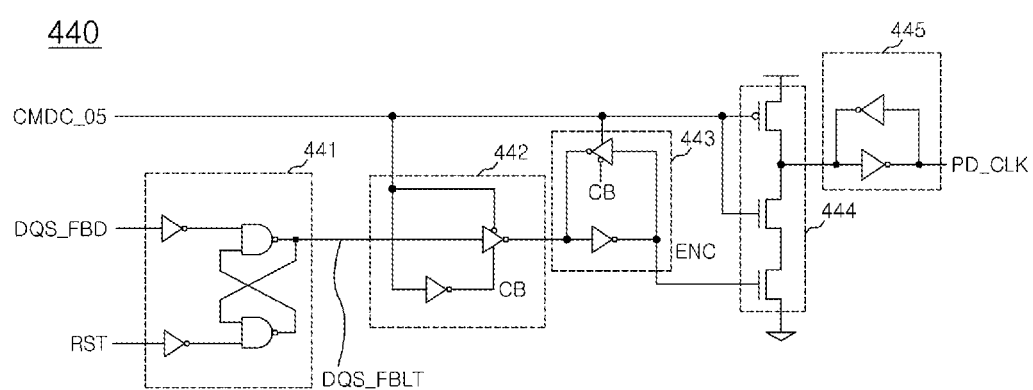
FIG. 4 is a circuit diagram illustrating a representation of an example of the trigger unit illustrated in FIG. 3.

Referring to FIG. 4, the trigger unit 440 may include a level signal generating section 441, aligning sections 442 and 443, a driver 444, and a latch 445.

The level signal generating section 441 may be configured to generate a level signal DQS_FBLT. The level signal DQS_FBLT may be generated in response to the third delayed signal DQS_FBD.

The level signal generating section 441 may be configured to transition the level signal DQS_FBLT to a high level in response to the rising edge of the third delayed signal DQS_FBD.

The level signal generating section 441 may be configured to reset the level signal DQS_FBLT. The level signal DQS_FBLT may be reset in response to a reset signal RST.

The level signal generating section 441 may include an SR latch.

The aligning sections 442 and 443 may be configured to align the level signal DQS_FBLT with the falling edge of the second delayed signal CMDC_05, and output a count enable signal ENC.

The aligning sections 442 and 443 may be configured to latch the count enable signal ENC during the high level duration of the second delayed signal CMDC_05.

The aligning section 442 may include a tri-state inverter and an inverter.

The tri-state inverter of the aligning section 442 passes the level signal DQS_FBLT in the examples where an output signal CB of the inverter is a high level and the second delayed signal CMDC_05 is a low level.

The aligning section 443 may include a tri-state inverter and an inverter.

The tri-state inverter of the aligning section 443 inverts the output signal CB of the aligning section 442, and outputs the count enable signal ENC.

The aligning section 443 latches the count enable signal ENC in the examples where the output signal CB of the aligning section 442 is a low level and the second delayed signal CMDC_05 is a high level.

The driver 444 may be configured to generate the trigger signal PD_CLK in response to the second delayed signal CMDC_05 during a period in which the count enable signal ENC is activated, that is for example, a period in which the count enable signal ENC is a high level.

The latch 445 may be configured to latch the trigger signal PD_CLK.

Figure 5:
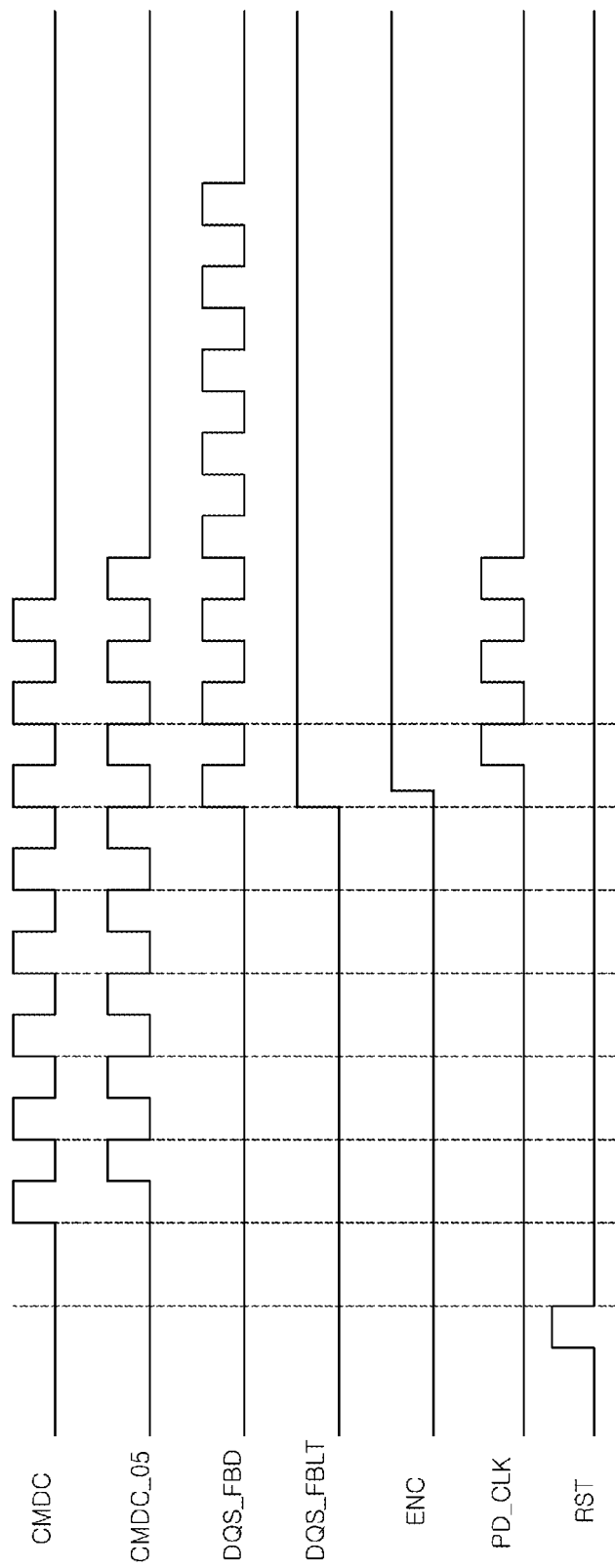
FIG. 5 is a representation of an example of an operation timing diagram of the trigger unit illustrated in FIG. 4.

Operations of the trigger unit 440 will be described below with reference to FIG. 5.

The third delayed signal DQS_FBD is reset to a low level by the reset signal RST.

The first delayed signal CMDC and the second delayed signal CMDC_05 are generated by using the internal signal iCAS.

The level signal DQS_FBLT transitions to the high level according to the rising edge of the third delayed signal DQS_FBD.

The level signal DQS_FBLT may not be aligned with the falling edge of the second delayed signal CMDC_05 in an actual operation.

Therefore, by the aligning sections 442 and 443 of FIG. 4, the level signal DQS_FBLT is aligned with the falling edge of the second delayed signal CMDC_05, and the count enable signal ENC is activated after the internal delay time of the aligning sections 442 and 443.

The pulses after the count enable signal ENC is activated, among the pulses of the second delayed signal CMDC_05, are outputted as the trigger signal PD_CLK.

That is to say, the pulse signals corresponding to the latency difference of the internal signal iCAS and the strobe signal DQS are outputted as the trigger signal PD_CLK.

Figure 6:
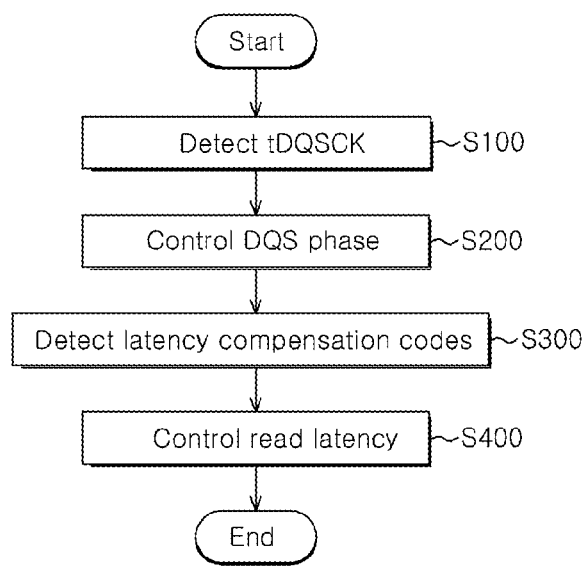
FIG. 6 is a representation of an example of a flow chart to assist in the explanation of an output timing control method of a semiconductor apparatus in accordance with an embodiment.

Operations of the output timing control circuit 100 of a semiconductor apparatus in accordance with an embodiment will be described below with reference to FIGS. 6 and 7.

A tDQSCK detecting operation (Detect tDQSCK), that is, an operation for detecting the phase difference of the strobe signal DQS and the clock signal CLK is performed (S100).

The control block 500 activates the first detection block 300 in response to the mode register set signal MRS.

The control block 500 causes the internal signal iCAS to be generated, by controlling the command decoder 120 through the command CMD.

The strobe signal DQS is generated by the internal signal iCAS.

The first detection block 300 detects the phase difference tDQSCK by using the feedback strobe signal DQS_FB and the delayed clock signal CLKD.

An operation for controlling the phase of the strobe signal DQS (Control DQS phase) is performed (S200).

The first detection block 300 controls the delay time of the strobe signal generation path 101 by the detected phase difference tDQSCK, and controls the phase of the strobe signal DQS.

An operation for detecting the latency compensation codes CNT (Detect latency compensation codes) is performed (S300).

The control block 500 deactivates the first detection block 300 and then activates the second detection block 400.

The control block 500 controls the command decoder 120 through the command CMD such that the internal signal iCAS is generated.

The strobe signal DQS is generated by the internal signal iCAS.

Figure 7:
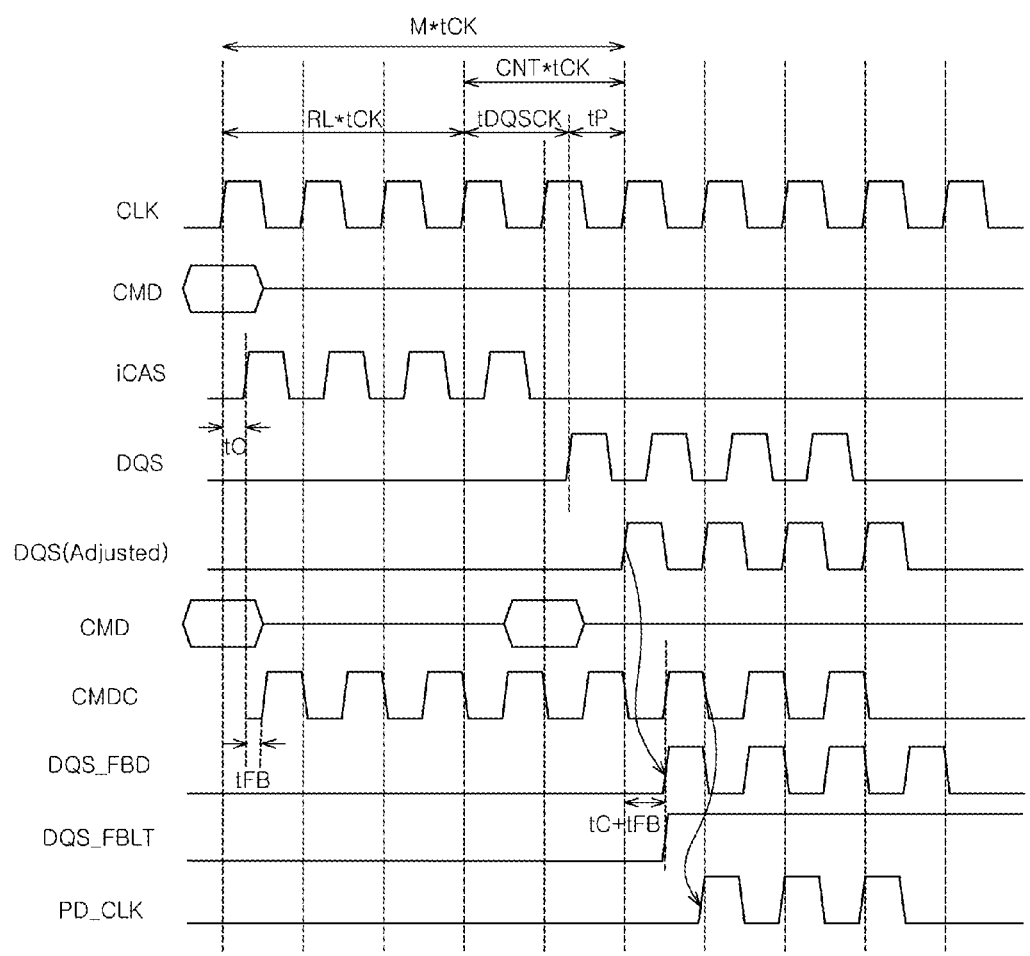
FIG. 7 is a representation of an example of an operation timing diagram of the output timing control circuit of a semiconductor apparatus in accordance with an embodiment.

FIG. 7 illustrates as an example that a read latency RL*tCK is 3tCK.

By subtracting the count value of the trigger signal PD_CLK from the count value of the first delayed signal CMDC, a latency to the time when the strobe signal DQS is generated from the command CMD generated by the control block 500, that is, a strobe latency M*tCK is detected.

Since the first delayed signal CMDC is 8tCK and the trigger signal PD_CLK is 3tCK, the strobe latency M*tCK may be 5tCK.

The difference between the strobe latency M*tCK and the read latency RL*tCK may be the values of the latency compensation codes CNT for controlling the read latency RL*tCK which is preset.

Since the strobe latency M*tCK is 5tCK and the read latency RL*tCK is 3tCK, 2tCK may be the values of the latency compensation codes CNT.

An operation for controlling the read latency RL (Control read latency) is performed (S400).

The output enable signal generation block 130 may perform the operation for controlling the read latency RL, by shifting the internal signal iCAS according to the value resulting from subtracting the latency compensation codes CNT from the read latency RL which is preset and thereby generating the output enable signal OUTEN.

The control block 400 deactivates the second detection block 400 after the operation (S400) for controlling the read latency RL is completed (End).

The above-described processes S100 to S400 may be performed in the initialization course of the semiconductor apparatus, and setting may be made such that the control block 500, the first detection block 300 and the second detection block 400 do not operate in a normal operation or a standby mode.

As is apparent from the above descriptions, in the embodiment, DQS phase correction and latency control may be quickly implemented in the initialization process of a semiconductor apparatus, and current consumption may not be caused in a standby mode.

Figure 8:
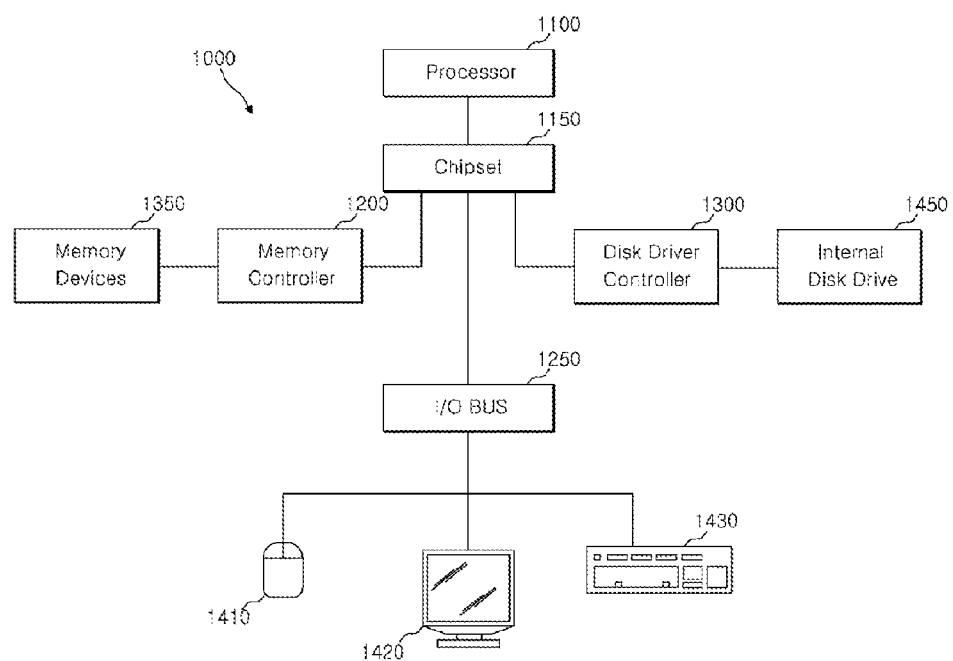
FIG. 8 illustrates a block diagram of an example of a representation of a system employing the output timing control method and/or including the output timing control circuit in accordance with the embodiments discussed above with relation to FIGS. 1-7.

The output timing control circuits and methods discussed above (see FIGS. 1-7) are particular useful in the design of memory devices, processors, and computer systems. For example, referring to FIG. 8, a block diagram of a system employing the output timing control method and/or including the output timing control circuit in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one output timing control circuit and/or employ at least one output timing control method as discussed above with reference to FIGS. 1-7. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the output timing control circuit and/or employ at least one output timing control method as discussed above with relation to FIGS. 1-7, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 8 is merely one example of a system employing the output timing control method and/or including the output timing control circuit as discussed above with relation to FIGS. 1-7. In alternate embodiments, such as cellular phones or digital cameras, the components may differ from the embodiments illustrated in FIG. 8.

While various embodiments have been described above, it will be understood to those skilled in the art that the embodiments described are by way of example only. Accordingly, the output timing control circuit of a semiconductor apparatus and the method thereof described herein should not be limited based on the described embodiments.

What is claimed is:

1. An output timing control circuit of a semiconductor apparatus, comprising:
   a strobe signal generation path configured to control a latency and a delay time of an internal column address strobe in response to a delay control signal and latency compensation codes, and generate a strobe signal;
   a first detection block configured to detect a phase difference of the strobe signal and a clock signal, and generate the delay control signal according to the detected phase difference;
   a second detection block configured to detect a latency difference of the strobe signal and the internal column address strobe, and generate the latency compensation codes according to the detected latency difference; and
   a control block configured to generate the command according to a preset timing.

2. The output timing control circuit according to claim 1, wherein the command comprises a read command.

3. The output timing control circuit according to claim 1, wherein the control block is configured to generate the command based on a mode register set signal.

4. The output timing control circuit according to claim 1, wherein the control block is configured to control activation periods of the first detection block and the second detection block, based on a mode register set signal.

5. The output timing control circuit according to claim 1, wherein the control block is configured to deactivate the first detection block and the second detection block after an initialization period of the semiconductor apparatus, based on a mode register set signal.

6. The output timing control circuit according to claim 1, wherein the strobe signal generation path comprises:
   a command decoder configured to decode the command, and generate the internal column address strobe;
   an output enable signal generation block configured to shift the internal column address strobe by a read latency controlled by the second detection block, and generate an output enable signal;
   a delay time control block configured to control a delay time of the output enable signal by a delay time controlled by the first detection block, and output a resultant signal; and
   a multiplexing block configured to generate the strobe signal in response to an output of the delay time control block.

7. An output timing control circuit of a semiconductor apparatus, comprising:
   a strobe signal generation path configured to control a phase of an internal column address strobe generated according to a read command, in response to a delay control signal, control a latency of the internal signal in response to a read latency and latency compensation codes, and generate a strobe signal;
   a first detection block configured to detect a phase difference of a feedback strobe signal and a delayed clock signal, and generate the delay control signal according to the detected phase difference;
   a second detection block configured to detect a latency difference of the feedback strobe signal and the internal column address strobe, and generate the latency compensation codes according to the detected latency difference; and
   a control block configured to generate the read command based on a mode register set signal.

8. The output timing control circuit according to claim 7, wherein the control block is configured to control activation periods of the first detection block and the second detection block, based on the mode register set signal.

9. The output timing control circuit according to claim 7, wherein the control block is configured to deactivate the first detection block and the second detection block after an initialization period of the semiconductor apparatus, based on the mode register set signal.

10. The output timing control circuit according to claim 7, wherein the strobe signal generation path comprises:
    a command decoder configured to decode the read command, and generate the internal column address strobe;
    an output enable signal generation block configured to shift the internal column address strobe by the latency controlled according to the read latency and the latency compensation codes, and generate an output enable signal;
    a delay time control block configured to control a delay time of the output enable signal in response to the delay control signal; and
    a multiplexing block configured to generate the strobe signal in response to an output of the delay time control block.

11. The output timing control circuit according to claim 10, wherein the output enable signal generation unit comprises:
- a subtraction unit configured to calculate a difference value of the read latency and the latency compensation codes, and generate controlled latencies; and
- a shifter configured to output a signal generated by shifting the internal column address strobe based on the delayed clock signal in conformity with the controlled latencies, as the output enable signal.

12. The output timing control circuit according to claim 7, wherein the first detection block comprises:
- a flip-flop configured to store a value of the feedback strobe signal, based on the delayed clock signal; and
- a register configured to store an output of the flip-flop, and output the delay control signal.

13. The output timing control circuit according to claim 7, wherein the second detection block comprises:
- first to third delay units configured to generate first to third delayed signals in response to the internal column address strobe or the feedback strobe signal;
- a trigger unit configured to generate pulses after the third delayed signal is at a predetermined level, among pulses of the second delayed signal, as a trigger signal;
- a first counter configured to count the first delayed signal;
- a second counter configured to count the trigger signal;
- a first subtraction unit configured to subtract an output of the second counter from an output of the first counter, and generate a strobe latency; and
- a second subtraction unit configured to subtract read latency from the strobe latency, and generate the latency compensation codes.

14. The output timing control circuit according to claim 13,
wherein the first delay unit is configured to delay the internal column address strobe by a feedback delay time, and generate the first delayed signal and
wherein the feedback delay time corresponds to a delay time until the feedback strobe signal is generated using the strobe signal.

15. The output timing control circuit according to claim 13, wherein the second delay unit is configured to delay the first delayed signal by a preset time and generate the second delayed signal, in order for a setup/hold timing margin of the third delayed signal and the second delayed signal.

16. The output timing control circuit according to claim 13,
wherein the third delay unit is configured to delay the feedback strobe signal by a command delay time, and generate the third delayed signal, and
wherein the command delay time corresponds to a delay time from input of the read command to generation of the internal column address strobe.

17. The output timing control circuit according to claim 13, wherein the trigger unit comprises:
- a level signal generating section configured to generate a level signal in response to the third delayed signal;
- aligning sections configured to align the level signal with the second delayed signal, and output a count enable signal; and
- a driver configured to generate the trigger signal in response to the second delayed signal during a period the count enable signal is at a predetermined level.

18. An output timing control method of a semiconductor apparatus, comprising:
- a phase difference detecting action of detecting a phase difference of a strobe signal and a clock signal;
- a phase controlling action of controlling a phase of the strobe signal according to the phase difference;
- a latency detecting action of detecting latency compensation codes for compensating for a latency difference of an internal column address strobe and the strobe signal; and
- a latency controlling action of controlling a read latency according to the latency compensation codes.

19. The output timing control method according to claim 18, wherein the phase difference detecting action comprises:
- generating internally a read command, and causing the internal column address strobe to be generated; and
- controlling a delay time and a latency of the internal column address strobe, and generating the strobe signal.

20. The output timing control method according to claim 18, wherein the latency detecting action comprises:
- generating internally a read command, and causing the internal column address strobe to be generated;
- detecting a strobe latency from input of the read command to generation of the strobe signal; and
- detecting a difference of the strobe latency and the read latency, as the latency compensation codes.

* * * * *